United States Patent
Nonaka et al.

(10) Patent No.: US 7,444,058 B2
(45) Date of Patent: Oct. 28, 2008

(54) RESIN COMPOSITION FOR OPTICAL WIRING, AND OPTOELECTRONIC CIRCUIT BOARD

(75) Inventors: Toshihisa Nonaka, Otsu (JP); Noboru Asahi, Otsu (JP); Yoshiko Tatsuta, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 11/713,605

(22) Filed: Mar. 5, 2007

(65) Prior Publication Data

US 2007/0147767 A1    Jun. 28, 2007

Related U.S. Application Data

(63) Continuation of application No. PCT/JP2005/016075, filed on Sep. 2, 2005.

(30) Foreign Application Priority Data

Sep. 8, 2004    (JP) .............................. 2004-260812

(51) Int. Cl.
G02B 6/00    (2006.01)

(52) U.S. Cl. ......................................... 385/142; 385/14

(58) Field of Classification Search ............... None
See application file for complete search history.

(56) References Cited

U.S. PATENT DOCUMENTS 5,783,624 A * 7/1998 Khanarian et al. .......... 524/494

6,788,874 B1   9/2004 Ishikawa et al. .............. 385/141

FOREIGN PATENT DOCUMENTS

| JP | 11-12465 A | 1/1999 |
|---|---|---|
| JP | 2000-321442 A | 11/2000 |
| JP | 2000-340907 A | 12/2000 |
| JP | 2001-83342 A | 3/2001 |
| JP | 2001-255428 A | 9/2001 |
| JP | 2002-6161 A | 1/2002 |
| JP | 2002-134926 A | 5/2002 |
| JP | 2002-520683 A | 7/2002 |
| JP | 2002-236228 A | 8/2002 |
| JP | 2003-133596 A | 5/2003 |
| JP | 2003-236835 A | 8/2003 |

* cited by examiner

*Primary Examiner*—Sarah Song
(74) *Attorney, Agent, or Firm*—Kubovcik & Kubovcik

(57) ABSTRACT

This invention is a resin composition for optical wiring, comprising an inorganic filler with an average particle size of 1 nm to 100 nm and a resin, having a ratio $n_f/n_r$ (where $n_f$ is the refractive index of the inorganic filler and $n_r$ is the refractive index of the resin) of 0.8 to 1.2, a thermal expansion coefficient of $-1\times10^{-5}$ /° C. to $4\times10^{-5}$/° C., and a true dependency value of its refractive index on the temperature of $-1\times10^{-4}$/° C. to $1\times10^{-4}$/° C. in a temperature range from $-20°$ C. to $90°$ C., and substantially incapable of absorbing light in a wavelength range from 0.6 to 0.9 μm or from 1.2 to 1.6 μm. This invention also provides an optoelectronic circuit board.

18 Claims, 1 Drawing Sheet

RESIN COMPOSITION FOR OPTICAL WIRING, AND OPTOELECTRONIC CIRCUIT BOARD

This application is a continuation of international application PCT/JP2005/016075 filed Sep. 2, 2005, which claims priority of Japanese patent application No. 2004-260812 filed Sep. 8, 2004, each of which is incorporated herein by reference.

TECHNICAL FIELD

The present invention relates to an optical wiring material suitable for integration with an electric wiring board, and to a optoelectronic circuit board. This optical wiring can be used as the "on-board optical wiring" (optical interconnection) that allows high speed signal transmission between LSIs (Large Scale Integrated circuits) by optical signals.

BACKGROUND ART

The ever progressing LSI technology has allowed higher information processing speed and larger integration scale. As a result, microprocessors are showing higher performance and memory chips are having larger capacities at rapid paces. Further, the high functions of these LSIs are already used in presently commercially available diverse electronic equipments such as digital home electronics for mainly presenting image information. Those electric equipments are personal computers, hard disc recorders, DVD recorders, etc.

In the conventional signal transmission over relative short distances, for example, between boards in each equipment or between chips on each board, electric signals are used, but further speedup and further densification are already difficult. For (1) further speedup, the signal delay due to the CR (C=electrostatic capacity of wiring, R=resistance of wiring) time constant of wiring is a problem, and for (2) further densification of electric wiring, EMI (Electromagnetic Interference) noise and inter-channel crosstalk are problems.

One of the technologies for solving these problems is optical wiring (optical interconnection) technology. Optical wiring can be applied to various places such as between equipments, between boards in an equipment, or between chips in a board. Above all, for signal transmission over short distances such as between chips, it is favorable to use an optical signal transmission system in which an optical wiring layer for waveguiding optical signals is formed on the surface of a substrate mounted with chips or as an inner layer.

Such an optical signal transmission system needs a light emitting device for converting electric signals into optical signals, a light sensing device for converting optical signals into electric signals, ICs for giving and receiving the electric signals used for controlling the light emitting device and the light sensing device, etc. and also the power supply to these devices. On the other hand, for the signal transmission that can be performed at a relatively low speed using low density wiring, the use of electric signals is mostly more advantageous. Therefore, in the wiring substrate, it is also necessary to form electric wiring on the surface of the substrate or as an inner layer. That is, an optoelectronic circuit board in which both optical wiring and electric wiring exist together is necessary.

The resin compositions used for optical wiring include polysilanes (see Patent Document 1), polysiloxanes (see Patent Document 2), fluorinated polyimides (see Patent Document 3), silica gel-polystyrene composite materials (see Patent Document 4), fluorinated acrylic polymers (see Patent Document 5), etc. None of the materials is adequate for integration with an electric wiring board for any of such reasons that the heat treatment temperature for solidification is too high, that heat resistance is insufficient, and that the thermal expansion coefficient is too large.

Optical wiring materials (optical waveguide materials) consisting of an inorganic filler and a resin include those containing titanium oxide, aluminum oxide or silica, etc. as the inorganic filler (see Patent Documents 6 and 7). However, they have such problems that the size of the particles used is large, and/or that since the refractive index of titanium oxide or aluminum oxide is larger than that of the resin, the Rayleigh scattering owing to the particles is large, hence as a result, the optical propagation loss is likely to be large.

As a hybrid optical wiring substrate having electric wiring and optical wiring, a mode in which an optical wiring layer is laid in an insulation layer (see Patent Document 8) or the like is proposed.

Patent Document 1: JP2004-12635A (claims)
Patent Document 2: JP2004-102247A (claims)
Patent Document 3: JP4-328504A (claims)
Patent Document 4: JP11-109154A (claims)
Patent Document 5: JP10-333105A (claims)
Patent Document 6: JP2000-44811A (claims)
Patent Document 7: JP2002-277664 (claims)
Patent Document 8: JP2002-6161A (claims)

DISCLOSURE OF THE INVENTION

Problems to Be Solved by the Invention

In the situation as described above, this invention provides a resin composition for optical wiring, which has a thermal expansion coefficient little different from that of the electric wiring board, and is small in the dependence of its refractive index on the temperature, small in optical propagation loss, and suitable for integration with the electric wiring board. This invention also provides a circuit board having the resin composition.

Means for Solving the Problems

This invention is a resin composition for optical wiring, comprising an-inorganic filler with an average particle size of 1 nm to 100 nm and a resin, having a ratio $n_f/n_r$ (where $n_f$ is the refractive index of the inorganic filler and $n_r$ is the refractive index of the resin) of 0.8 to 1.2, a thermal expansion coefficient of $-1 \times 10^{-5}/°$ C. to $4 \times 10^{-5}/°$ C., and a true dependency value of its refractive index on the temperature of $-1 \times 10^{-4}/°$ C. to $1 \times 10^{-4}/°$ C. in a temperature range from $-20°$ C. to $90°$ C., and substantially incapable of absorbing light in a wavelength range from 0.6 to 0.9 μm or from 1.2 to 1.6 μm.

Effects of the Invention

If the resin composition for optical wiring of this invention is used, an optical wiring layer having a thermal expansion coefficient little different from that of the electric wiring board, small in the dependency of its refractive index on the temperature, and suitable for integration with the electric wiring layer can be obtained. If the resin composition of this invention is used, an optoelectronic circuit board small in optical propagation loss, durable against temperature change and stable in light transmission characteristics can be obtained.

Figure 1:
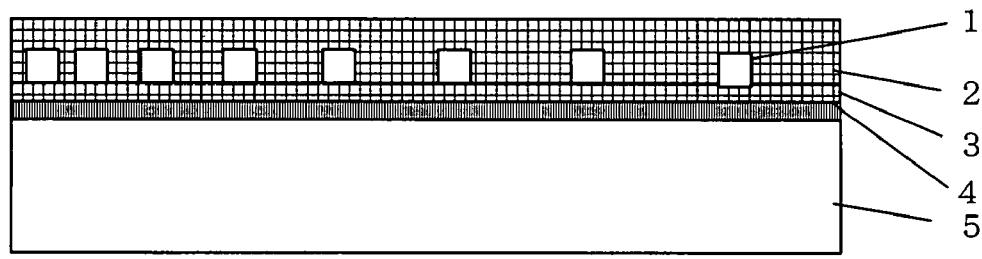
FIG. 1 is a cross sectional view of an optical wiring substrate for evaluation of crosstalk.

MEANINGS OF SYMBOLS 1 core layer
2 over-cladding layer
3 under-cladding layer
4 copper layer with black oxide treatment
5 FR-4 substrate

THE BEST MODES FOR CARRYING OUT THE INVENTION

An electric wiring board is generally made of a composite material consisting of a resin and an inorganic material, and its physical properties show intermediate values between those of the resin and those of the inorganic material. The optical wiring material suitable for integration with the electric wiring board is required to have a property of efficient light propagation, and further especially in view of reliability, it is necessary that the thermal and mechanical properties, production process, etc. of the optical wiring material match those of the electric wiring board. To ensure these matters, it is an effective means that the optical wiring material is also a composite material consisting of a resin and an inorganic material. However, a composite material includes the interfaces between the compounded materials, and they cause light scattering and is likely to increase the optical propagation loss. The magnitude of light scattering depends on the refractive index difference between the materials and the sizes and quantity of the interfaces. If these are accurately controlled, light scattering can be suppressed to a practically negligibly low level.

In this invention, to suppress the light scattering of the light waveguided in the optical wiring, caused by the inorganic filler, it is necessary that the average particle, size of the inorganic filler is 1 nm to 100 nm. If the average particle size of the inorganic filler is 1 nm or more, the particles of the inorganic filler are unlikely to cohere and can be easily dispersed more uniformly. If the average particle size of the inorganic filler is 100 nm or less, the ununiformity of refractive index, for example, due to the settling of the inorganic filler particles is unlikely to occur when the film is formed. Therefore, disturbance of light propagation is small and no signal transmission error is likely to occur. If the average particle size of the inorganic filler is 40 nm or less, Rayleigh scattering can be easily suppressed even if the refractive index difference between the resin and the inorganic filler is not extremely small. In this case, further, the Rayleigh scattering caused by the local refractive index difference between the resin and the inorganic filler attributable to the respective proportion fluctuations of the resin and the inorganic filler can also be kept small.

Meanwhile, the average particle size of the inorganic filler of this invention can be measured by the XMA measurement and transmission electron microscope (TEM) observation of a ultra thin slice of a cured thin film formed of the resin composition for optical wiring. The ultra thin slice can be obtained by cutting a cured thin film formed of the resin composition for optical wiring normal to the film surface, to expose its cross section. Since the inorganic filler and the resin are different in electron beam transmittance, they can be identified in reference to the difference of contrast in the observed TEM image. In the case where plural inorganic fillers are used, the respective inorganic fillers can be identified by performing the elementary analysis based on XMA measurement and the crystal structure analysis based on the observation of the electron beam diffraction image. The observed TEM image can be analyzed to obtain the area distribution of the inorganic filler and the resin, and the cross sectional form of each inorganic filler particle can be approximated by a circle, to calculate the particle diameter from its area. The particle diameter can be evaluated on TEM images magnified to 5000× and 40000×. The distribution of the calculated particle sizes is expressed as a histogram at 0.1 μm intervals based on a 5000×TEM image and as a histogram at 0.01 μm intervals based on a 40000×TEM image. For each column of the obtained histogram, the product of the central value and the frequency is obtained. Then, the sum of the products of all the columns is divided by the total sum of the frequencies, to obtain the average particle size. Meanwhile, the particle size distribution can be evaluated also by performing the same analysis as described above by using a scanning electron microscope (SEM) instead of TEM.

In addition to the above, the average particle size can be measured also by a dynamic light scattering method of measuring the fluctuation of scattering light caused by the Brownian motion of the inorganic filler or an electrophoretic light scattering method of measuring the Doppler effect of scattering light occurring when the inorganic filler is electrophoresed, etc. Laser diffraction type and laser scattering type particle size distribution measuring instruments include LA-920 produced by Horiba, Ltd., SALD-1100 produced by Shimadzu Corporation, MICROTRAC-UPA150 produced by Nikkiso Co., Ltd., etc.

In this invention, the inorganic filler content is not especially limited. It is preferred that the volume content of the inorganic filler is 5 vol % to 95 vol %. A more preferred range is 20 vol % to 80 vol %. If the inorganic filler volume content is 5 vol % or more, the effect of controlling the thermal expansion coefficient and the effect of controlling the dependency of the refractive index on the temperature by adding the inorganic filler are large. If the inorganic filler volume content is 20 vol % or more, the thermal expansion coefficient is likely to be $4 \times 10^{-5}/°C$. or less. If the inorganic filler volume content is 95 vol % or less, the film is unlikely to be fragile, and it does not happen that a slight stress causes cracking or breaks the film. If the inorganic filler volume content is 80 vol % or less, the adhesive strength of the resin composition to the material it contacts becomes large, and the decline of reliability due to delamination, etc. is unlikely to occur.

In this invention, it is preferred that the ratio $n_f/n_r$ of the refractive index $n_f$ of the inorganic filler to the refractive index $n_r$ of the resin is 0.8 to 1.2. A more preferred range is 0.9 to 1.1. If $n_f/n_r$ is 0.8 or more, the resin composition is practically useful, since the optical propagation loss due to scattering becomes small. If $n_f/n_r$ is 0.9 or more, it is not necessary to use the inorganic filler particles extremely small in particle size needed for reducing the optical propagation loss caused by scattering when $n_f/n_r$ is very small, and the particles can be easily uniformly dispersed while their cohesion is inhibited. Further, if $n_f/n_r$ is 1.2 or less, the resin composition is practically useful, since the optical propagation loss caused by scattering is small. If $n_f/n_r$ is 1.1 or less, it is not necessary to use the inorganic filler particles extremely small in particle size needed for reducing the optical propagation loss caused by scattering when $n_f/n_r$ is very small, and the particles can be easily uniformly dispersed while their cohesion is inhibited.

It is preferred that the thermal expansion coefficient of the resin composition for optical wiring of this invention is $-1 \times 10^{-5}/°C$. to $4 \times 10^{-5}/°C$. in a temperature range from $-20°$ C. to $90°$ C. A more preferred range is $1.5 \times 10^{-5}/°C$. to $2.5 \times 10^{-5}/°C$. If the thermal expansion coefficient of the resin composition for optical wiring is $-1 \times 10^{-5}/°$ C. to $4 \times 10^{-5}/°$ C. in a temperature range from $-20°$ C. to $90°$ C., the optoelectronic circuit board obtained from the resin composition is unlikely to cause delamination, since the thermal expansion coefficient difference between the electric wiring board material and the resin composition is small. If the thermal expansion coefficient of the resin composition for optical wiring is $1.5 \times 10^{-5}/°$ C. to $2.5 \times 10^{-5}/°$ C., the optoelectronic circuit board obtained from the resin composition is unlikely to be warped when the temperature changes, since the thermal expansion coefficient difference between the resin composition and the electric wiring board material generally with a thermal expansion coefficient of about 20 ppm/° C. is very small. For this reason, no error is likely to occur in the alignment between mounted optical parts and optical waveguide, and no cracking occurs at the connection points between the optoelectronic circuit board and the mounted optical parts.

It is preferred that the resin composition for optical wiring of this invention has a true dependency value of its refractive index on the temperature of $-1 \times 10^{-4}/°$ C. to $1 \times 10^{-4}/°$ C. in a temperature range from $-20°$ C. to $90°$ C. A more preferred range is $-1 \times 10^{-5}/°$ C. to $1 \times 10^{-5}/°$ C. If the resin composition for optical wiring has a true dependency value of its refractive index on the temperature of $-1 \times 10^{-4}/°$ C. to $1 \times 10^{-4}/°$ C. in a temperature range from $-20°$ C. to $90°$ C., the change of the optical wiring length caused by the temperature change during use can be kept small, and the optical coupling with the light sensing and emitting parts is unlikely to be miss-aligned, allowing the transmission signal error rate to be kept small. If the resin composition for optical wiring has a true dependency value of its refractive index on the temperature of $-1 \times 10^{-5}/°$ C. to $1 \times 10^{-5}/°$ C. in a temperature range from $-20°$ C. to $90°$ C., no error is likely to occur in the wavelength selection of a wavelength multiplexing transmission system, though such an error can occur otherwise owing to the change of optical path length caused by the temperature change during use. Meanwhile, the true dependency value of the refractive index on the temperature in this invention refers to the dependency value of the refractive index on the temperature corrected by canceling the volume change of the material caused by temperature change. To describe it in more detail, in the case where the length of a material changes from $X_1$ to $X_2$ in the incidence direction of the light used for measuring the refractive index when the temperature changes from $T_1$ to $T_2$, the material density in the optical sense is $X_1/X_2$. So, from the refractive index $n_1$ at temperature $T_1$ and the refractive index $n_2$ at temperature $T_2$, the true dependency value (D) of the refractive index on the temperature in a temperature range between $T_1$ and $T_2$ can be obtained from the following formula:

[Numerical formula 1]

$$D = \frac{n_2 - n_1}{T_2 - T_1} \cdot \frac{X_2}{X_1}$$

The optical propagation loss important for optical wiring depends on the structure of the optical wiring, optical wiring pattern, the state of the optical wiring surface after processing and the physical properties of the optical wiring material. The optical propagation loss due to the physical properties of a material include the absorption and scattering by the material. The absorption can be suppressed by using a transparent material, i.e., a material that does not absorb light at the wavelength of the waveguided light. However, with regard to scattering, Rayleigh scattering is a problem in a material containing an inorganic filler, i.e., particles as in this invention.

Rayleigh scattering can be expressed by the product of the scattering cross section of the particles and the particle density. The scattering cross section of the particles can be expressed by the following numerical formula:

[Numerical formula 2]

$$\frac{8}{3}\left(\frac{\pi n_r a \times 10^{-7}}{\lambda \times 10^{-4}}\right)^4 \left(\frac{\left(\frac{n_f}{n_r}\right)^2 - 1}{\left(\frac{n_f}{n_r}\right)^2 + 2}\right)^2 \frac{\pi (a \times 10^{-7})^2}{4}$$

where a is the average particle size (nm) of the inorganic filler; $n_f$ is the refractive index of the inorganic filler; $n_r$ is the refractive index of the resin; and $\lambda$ is the wavelength (μm) of the light waveguided in the optical wiring.

Further, the particle density can be expressed by the following numerical formula:

[Numerical formula 3]

$$\frac{6}{\pi (a \times 10^{-7})^3}$$

If the optical propagation loss (dB/cm) by Rayleigh scattering is expressed using the above two numerical formulae, it can be expressed as L of the following formula, and in this invention, L must be in a range of $0 \leq L \leq 0.5$.

[Numerical formula 4] (1)

$$L = -10 \log e^{-x}$$

$$0 \leq L = -10 \log e^{-x} \leq 0.5$$

$$x = V \times \frac{6}{\pi (a \times 10^{-7})^3} \times \frac{8}{3}\left(\frac{\pi n_r a \times 10^{-7}}{\lambda \times 10^{-4}}\right)^4 \left(\frac{\left(\frac{n_f}{n_r}\right)^2 - 1}{\left(\frac{n_f}{n_r}\right)^2 + 2}\right)^2 \frac{\pi (a \times 10^{-7})^2}{4}$$

where V is the volume content of the inorganic filler; a is the average particle size (nm) of the inorganic filler; $n_f$ is the refractive index of the inorganic filler: $n_r$ is the refractive index of the resin; and $\lambda$ is the wavelength (μm) of the light waveguided in the optical wiring; subject to $0.05 \leq V \leq 0.95$, $1 \leq a \leq 100$, $1.2 \leq n_f \leq 2.4$, $1.3 \leq n_r \leq 2$, and $0.6 \leq \lambda \leq 0.9$ or $1.2 \leq \lambda \leq 1.6$.

L denotes the optical propagation loss and cannot be a minus number. Further, an L of larger than 0.5 is not practical, for such reasons that the optical propagation (waveguide) loss is too large and that in the case where the resin composition is used as an optical wiring material, the error rate becomes high in high speed signal transmission.

A wavelength, range from 0.6 to 0.9 μm includes the oscillation wavelengths of He-Ne gas laser and GaAs-based compound semiconductor laser, etc., and this is promising for use as transmission signal light. Therefore, it is practically important that a resin composition for optical wiring has a property satisfying the formula (1) in a wavelength range of 0.6 to 0.9 μm. In the case where information is exchanged between LSIs, if the individual LSIs use different wavelengths for sending information, the light beams from plural LSIs can be collectively passed through one optical wire in a wavelength multiplexing system. A wavelength multiplexing system is a practically effective means, since the wiring, density can be substantially enhanced. Further, a wavelength range from 1.2 to 1.6 µm includes the oscillation wavelengths of InGaAsP and other semiconductor lasers, and it is practically important that the resin composition for optical wiring of this invention has a property satisfying the formula (1) in a wavelength range of 1.2 to 1.6 µm. Moreover, it is necessary that the resin composition for optical wiring of this invention is a compound substantially incapable of absorbing light in a wavelength range from 0.6 to 0.9 µm or in a wavelength range from 1.2 to 1.6 µm.

In this invention, the method for measuring the thermal expansion coefficient of the resin composition for optical wiring is not especially limited, but it can be measured using a thermomechanical analyzer (TMA) or stress measuring instrument, etc. Further, the method for measuring the refractive index of the resin composition for optical wiring of this invention is not especially limited, but it can be measured using a prism coupler, etc. The refractive index of an inorganic filler is generally almost equal to that of the bulk material with the same chemical composition, but more accurately, it can be measured by the following method. At first, the refractive index ($n_m$) of the cured resin alone used for dispersing an inorganic filler is measured. Then, a cured material with a predetermined inorganic filler homogeneously dispersed in the resin is prepared, and its refractive index ($n_c$) is measured. From the following relational formula showing the relation among the refractive index ($n_n$) of the inorganic filler, the volume percentage ($V_m$ %) of the resin and the volume percentage ($V_n$ %) of the inorganic filler, the refractive index of the inorganic filler can be obtained. To evaluate the dependency of the refractive index on the temperature, an evaluation instrument that can change the temperature of the sample to be measured is used.

[Numerical formula 5]

$$n_c = \frac{V_m \cdot n_m + V_n \cdot n_n}{100}$$

The resin used in this invention is not especially limited, but in the combination with the inorganic filler, it is only required that the $n_c/n_r$ described before satisfies 0.8 to 1.2. It is more preferred to satisfy the formula (1). Examples of the resin include polyphenylene ethers, polyphenylene sulfides, polyethersulfones, polyetherimides, liquid crystal polymers, polystyrene, polyethylene, fluorine resins, epoxy resins, phenol resins, siloxane resins, polyimides, acrylic resins, cyanate resins, benzocyclobutene resins, polynorbornenes, BT (bismaleimide triazine) resins, polyolefins, polyacrylates, polyallylates, melamine resins, polymethacrylates, polystyrene, polycarbonates, aramid resins, etc.

The inorganic filler used in this invention is not especially limited, and at least one selected from materials containing any bond of Si—O bond, Mg—O bond and Al—O bond is preferred. Materials having Si—O bond, Mg—O bond or Al—O bond are chemically stable, and for this reason, they are large in energy gap in a solid state. That is, most of them are transparent. Further, they are preferred, since the refractive indexes of most of them in a solid state are in a range from about 1.4 to about 1.8; which is a refractive index range of resins. Examples of the inorganic filler include $SiO_2$, $Al_2O_3$, MgO, $MgAl_2O_4$ and double oxides of Al and Si, Mg and Al, Mg and Si, and Ti and Si, and solid solutions of the foregoing, etc. Moreover, solid solutions obtained by dissolving any of the oxides of Ca, Sc, Ti, V, Cr, Mn, Fe, Co, Ni, Cu, Zn, Ga, Ge, As, Se, Rb, Sr, Y, Zr, Nb, Mo, Tc, Ru, Ag, In, Sn, Sb, Te, Cs, Ba, Hf, Ta, W, Re, La, Ce, Pr, Nd, Pm, Sm, Eu, Gd, Tb, Dy, Ho, Er, Tm, Yb, Lu, etc. into the foregoing can be used. As other double oxides, $CaSiO_3$, $ZrSiO_4$, $BaCrO_4$, $ZrCrO_4$, etc. can be used. Metal sulfates can also be preferably used as inorganic fillers, and they include barium sulfate, calcium sulfate, strontium sulfate, etc. As barium sulfate, precipitated barium sulfate is preferred, since particles with a small particle size can be easily obtained. Other usable inorganic materials include carbonates such as barium carbonate and calcium carbonate and fluorides such as magnesium fluoride, sodium fluoride, barium fluoride, calcium fluoride, strontium fluoride and lithium fluoride. In addition to these inorganic materials, any material with the refractive index in a range from 1.4 to 2.4 can be used alone or as a double oxide with any of said oxides.

An optical wire has a structure, in which a cladding layer with a small refractive index covers a core layer with a large refractive index, so that light can be waveguided in it. Light is mainly waveguided in the core layer, while the cladding layer covering the core layer functions to confine light in it. If the refractive index difference between the core layer and the cladding layer is larger, the effect of confining light is larger. Even if such an optical wire is bent at a small radius of curvature, light is unlikely-to leak. Since the optical wiring material of this invention is mainly composed of a resin and an inorganic filler, it is effective to keep the refractive index difference between the resin and the inorganic filler small in order that the optical propagation loss caused by scattering due to the inorganic filler can be kept small. Therefore, it is a favorable means for ensuring an optical wiring material having a low loss and a large refractive index difference between the core layer and the cladding layer, that a resin with a high refractive index and an inorganic filler with a refractive index close to it are used as the material for forming the core layer, while a resin with a low refractive index and an inorganic filler with a refractive index close to it are used as the material for forming the cladding layer.

It is preferred that the resin with a larger refractive index, i.e., the resin used in the- core layer for the optical wiring material is at least one selected from group A with the refractive index ranging from 1.55 to 1.75 consisting of polyimide resins, aramid resins, polystyrene, polycarbonates and epoxy resins in view of transparency and refractive index. As the inorganic filler, it is preferred to select at least one from group B with the refractive index ranging from 1.55 to 1.75 consisting of barium sulfate, magnesium oxide, aluminum oxide, calcium carbonate, zinc oxide, tin oxide and a double oxide of titanium and silicon in view of transparency and refractive index. Among resin materials, resins with a refractive index of more than 1.75 are likely to have such problems that even if they can be synthesized, they are very expensive, high in curing temperature and unlikely to be dissolved in solvents. If the refractive index of the resin used in the core layer for the optical wiring material is less than 1.55, or if the refractive index of the inorganic filler used with such a resin is less than 1.55, the refractive index difference between the core layer and the cladding layer is so small as to lower the effect of confining light.

It is preferred that the resin with a smaller refractive index, i.e., the resin used in the cladding layer for the optical wiring material is at least one selected from group C with the refractive index ranging from 1.3 to 1.55 consisting of epoxy resins, siloxane resins, polyimide resins and polysilanes in view of transparency and refractive index. As the inorganic filler used with such a resin, it is preferred to select at least one selected from group D with the refractive index ranging from 1.3 to 1.55 consisting of silica, magnesium carbonate, calcium silicate, hydrotalcite, magnesium fluoride and a double oxide of titanium and silicon in view of transparency and refractive index. Meanwhile, few inorganic fillers with a refractive index of less than 1.3 exist. So, substantially an inorganic filler with a refractive index of 1.3 or more is inevitably used. The refractive index of the double oxide of titanium and silicon can be adjusted by adjusting the content ratio of titanium and silicon. A double oxide with a relatively larger titanium content has a larger refractive index, and a double oxide with a relatively larger silicon content has a smaller refractive index.

It is preferred that the resins used in this invention are thermosetting. Since the resins used to form electric wiring substrates are mostly thermosetting resins, the thermosetting resins used in this invention are suitable for integration with electric wiring substrates for the reason that they are high in process affinity. That is, in the process for integrating the optical wiring with the electric wiring board, there are such advantages that the existing process for producing the electric wiring board can be used as it is and that only the process for integrating with the electric wiring board is required to be added without the necessity of changing the other processes.

In the case where the resin used is not a thermosetting resin, the process for integrating with the electric wiring substrate is likely to be complicated, and the heat resistance needed especially in high temperature processes such as a soldering process for mounting electronic parts is likely to be insufficient.

Examples of the thermosetting resins include, though not especially limited to, epoxy resins, phenol resins, siloxane resins, polyimides, cyanate resins, benzocyclobutene resins, polynorbornenes, etc.

In the above, an epoxy resin refers to a resin having a prepolymer containing two or more epoxy groups (oxirane rings) in the molecular structure.

Among epoxy resins, those having cyclohexane rings and those having naphthalene skeleton are preferred for such reasons that transparency is high in a wavelength range from 0.4 to 0.9 μm and that the inorganic filler can be dispersed at a high concentration.

Further, it is preferred that the epoxy equivalent of the epoxy resin is 100 g/eq to 300 g/eq. If the epoxy equivalent is 100 g/eq or more, the number of hydroxyl groups produced by the curing reaction is small and the hydroxyl group concentration is low. So, moisture is unlikely to be absorbed, and the change of refractive index due to moisture absorption is unlikely to occur. If the epoxy equivalent is 300 g/eq or less, the crosslinking density can be large, and the decline of adhesiveness and cracking resistance caused by the rise of internal stress during curing is small.

In this invention, as required, a curing agent is added. For example, any of the curing agents generally used for epoxy resins can be used. Examples of such curing agents include amine curing agents, acid anhydride curing agents, phenol curing agents, phenol novolak resins, bisphenol A novolak resins, aminotriazine compounds, naphthol compounds, etc. Two or more of these curing agents can also be used together.

Further, a curing accelerator can be used together with a curing agent. Examples of the curing accelerator include 2-methylimidazole, 2-ethyl-4-methylimidazole, 1-cyanoethyl-2-phenylimidazole, 1-cyanoethyl-2-phenylimidazolium trimellitate, triphenylphosphine, metal chelate compounds such as tris(2,4-pentadionato)cobalt, benzimidazole compounds, etc.

For rendering a resin composition transparent in a wavelength range from 1.2 to 1.6 μm, it is effective to decrease the C-H bonds existing in the resin. If the hydrogen bound to carbon is replaced by fluorine or heavy hydrogen, the C-H bonds can be decreased.

It is preferred that the resin used in this invention has a curing temperature of 200° C. or lower. The curing temperature in this invention refers to both the temperature at which the inter-molecular crosslinking reaction of the resin used occurs to cause a reaction of enhancing the molecular weight while forming a mesh network, and the temperature at which a resin dissolved in a solvent already as a polymer is solidified by evaporating the solvent.

Meanwhile, it is only required that the resin used in this invention has sufficient heat resistance, even if it is not a thermosetting resin. The resins that are not thermosetting resins but have sufficient heat resistance include aramid resins, etc. As aramid resins, those obtained by polymerizing a carboxylic acid dichloride and a diamine can be preferably used in view of excellent transparency and heat resistance.

Examples of the diamine include 4,4'-diaminodiphenyl ether, 3,4'-diaminodiphenyl ether, 4,4'-diaminodiphenylsulfone, 3,3'-diaminodiphenylsulfone, 2,2'-ditrifluoromethyl-4,4'-diaminobiphenyl, 9,9-bis(4-aminophenyl)fluorene, 9,9-bis(4-amino-3-methylphenyl)fluorene, 9,9-bis(4-amino-3-chlorophenyl)fluorene, 9,9-bis(4-amino-3-fluorophenyl)fluorene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis(4-aminophenyl)hexafluoropropane, etc. Preferred are 4,4'-diaminodiphenylsulfone, 3,3'-diaminodiphenylsulfone, 2,2'-ditrifluorometyl-4,4'-diaminobiphenyl, 9,9-bis(4-aminophenyl)fluorene, 9,9-bis(4-amino-3-methylphenyl)fluorene, 9,9-bis(4-amino-3-chlorophenyl)fluorene, and 9,9-bis(4-amino-3-fluorophenyl)fluorene.

Examples of the carboxylic acid dichloride include terephthalic acid dichloride, 2-chloro-terephthalic acid dichloride, 2-fluoro-terephthalic acid dichloride, isophthalic acid dichloride, orthophthalic acid dichloride, naphthalene dicarbonyl chloride, biphenyl dicarbonyl chloride, terphenyl dicarbonyl chloride, etc.

In this invention, the resin composition for optical wiring can be obtained by coating a paste with an inorganic filler dispersed in a resin, drying and solidifying. The paste can be prepared, for example, by a method of adding an inorganic filler powder to a resin solution and mixing for dispersing, or a method of preparing a dispersion with an inorganic filler dispersed in an adequate solvent and mixing the dispersion and a resin solution, the latter being called the letdown method. Further, an inorganic filler dispersion commercially available as a sol can also be used. For example, in the case of silica, organo-silica sol or colloidal silica sol with a particle size of several nanometers to 100 nm or more sold by Nissan Chemical Industries, Ltd., Fuso Chemical Co., Ltd. or Catalysts & Chemicals Industries Co., Ltd. etc. can be used.

The method for dispersing an inorganic filler into a resin or a solvent is not especially limited. For example, ultrasonic dispersion or a method of using a ball mill, roll mill, CLEARMIX, homogenizer, bead mill, media dispersing machine or the like can be used. Especially in view of dispersibility, it is preferred to use a ball mill, homogenizer or bead mill.

For enhancing the dispersibility of the inorganic filler, for example, the inorganic filler may be treated on the surfaces of the particles, or a dispersing agent, surfactant or solvent can also be added. The surface treatment of the inorganic filler can be a treatment by any of various coupling agents such as a silane coupling agent, titanium coupling agent or aluminum coupling agent, fatty acid or phosphoric ester, etc., rosin treatment, acid treatment, base treatment, etc. Further, a nonionic, cationic or anionic surfactant, a wetting agent such as a polycarboxylic acid, amphiphatic material, or a resin having substituent groups with high steric hindrance, etc. can also be added. Furthermore, the polarity of the system during or after dispersion can be controlled by adding a solvent. Moreover, the paste can contain, as required, a stabilizer, dispersing agent, anti-settling additive, plasticizer, antioxidant, etc. to such an extent that the required properties can be satisfied.

The optoelectronic circuit board of this invention has a layer having an organic substance and a fiber material, a conductive layer and an optical waveguide (optical wiring) layer, and said resin composition for optical wiring of this invention is used in the optical waveguide layer. Further, the layer having an organic substance and a fiber material, the conductive layer and the optical waveguide layer can also be laminated to form the optoelectronic circuit board.

The layer having an organic substance and a fiber material is not especially limited, if it can be used for electric wiring substrates. It can be obtained, for example, by impregnating a fiber material with an epoxy resin, fluorine resin, polyphenylene oxide, cyanate resin or polyimide resin alone, or a material obtained by modifying any of the foregoing, or a mixture consisting of two or more of the foregoing, drying the impregnated fiber material to prepare a prepreg, heating and molding it and curing the molding. The resin can contain, as required, a curing agent, reaction initiator, filler, solvent, etc. and inorganic particles such as silica.

The fiber material can be composed of glass fibers such as a woven glass fabric, nonwoven glass fabric or glass paper, a paper (pulp) sheet, a woven fabric or nonwoven fabric composed of organic fibers such as aramid, polyester or fluorine resin, a woven fabric or nonwoven fabric composed of metallic fibers, carbon fibers or mineral fibers, etc. Among these fiber materials, glass fibers are preferred in view of heat resistance and strength, and among them, carded glass fibers are more preferred, since high flatness can be achieved after curing of the prepreg. After the carding process, the warp yarns and/or the weft yarns adjacent to each other are arranged substantially without any clearance.

For the conductive layer, a highly conductive metallic foil or a conductive material obtained by curing a paste can be used. The metallic foil can be, for example, a foil of copper, aluminum, nickel or gold alone, or any of their alloys, or a composite foil. It is preferred to use a copper foil.

The optical waveguide layer consists of an under-cladding layer/core layer/over-cladding layer. The refractive index of the core layer must be larger than the refractive index of the under-cladding layer and the refractive index of the over-cladding layer. Unless the refractive index of the core layer is larger than the refractive index of the under-cladding layer and the refractive index of the over-cladding layer, no optical waveguide takes place.

The types of the optical waveguide formed in the optical waveguide layer can be structurally roughly classified into a slab optical waveguide for confining the light of upper and lower layers only, and a channel optical waveguide with a structure for also confining the light of transverse direction. A channel optical waveguide consists of a core portion with a large refractive index mainly used for optical propagation and a cladding portion with a small refractive index for covering the core portion. The modes of the channel optical waveguide can be classified into a buried type optical waveguide with the core portion buried in the cladding portion, a ridge type optical waveguide with a projection in the cross sectional form of the optical waveguide, and a loaded type optical waveguide with a dielectric or the like disposed on the surface for changing the refractive index nearby.

The optical waveguide layer has at least two layers different in refractive index (a core layer and a cladding layer). In this case, it is preferred that the refractive index difference between the layers is 0.05 or more. In view of the optical axis adjustment (alignment) of optical wiring and between optical parts and cost reduction, it is preferred to use a multimode optical waveguide in the optoelectronic circuit board, and it is preferred that light can be sufficiently confined even if a bent portion with a small radius of curvature is formed when the optical waveguide is arranged. To achieve these two matters, it is optically more advantageous that the refractive index difference between the core layer and the cladding layer is larger. Therefore, if the refractive index difference is 0.05 or more, it is not necessary to very accurately adjust (align) the optical axes between optical wiring and optical parts or to make the thickness of the cladding layer very large. So, cost is not raised.

The refractive indexes and thicknesses of the under-cladding layer, the core layer and the over-cladding layer can be selected as desired to suit the optical waveguide to be designed. A multimode waveguide is suitable for enlarging the refractive index difference between the core layer and the under-cladding layer, enlarging the refractive index difference between the core layer and the over-cladding layer, and thickening the core layer. In the case of single mode, efforts are made to lessen the refractive index difference between the core layer and the under-cladding layer, to lessen the refractive index difference between the core layer and the over-cladding layer, and to thin the core layer. By doing so, single mode propagation can be achieved.

The optoelectronic circuit board of this invention can be produced, for example, as described below. At first, the substrate for electric wiring is coated with a paste for the under-cladding layer of optical wiring, and it is dried to form a resin composition film for optical wiring. Then, the core layer is coated with a paste for the core layer of optical wiring, and it is dried to form a resin composition film for optical wiring. As required, the core layer is processed to have a pattern. The patterning can be performed by reactive etching, etc. In the case where a photosensitive paste for optical wiring is used for the core layer, photolithography involving exposure and development can be used for pattern formation. In succession, the core layer is coated with a paste for the over-cladding layer of optical wiring, and it is dried to form a resin composition film for optical wiring. Then, as required, the laminate is overlaid on the substrate for electric wiring, and a hot press or the like is used to obtain an optoelectronic circuit board. The optical waveguide layer can also be formed as an inner layer of the optoelectronic circuit board, or formed as a surface layer. In the case where it is formed as an inner layer, there is an advantage that the surface of the optoelectronic circuit board can be widely used for mounting electronic parts on the surface.

If the surface of the electric wiring board, on which the under-cladding layer is formed, is very rough, the roughness affects the surface of the formed under-cladding-layer, to make it less smooth, and the interface between the surface of the under-cladding layer and the core layer formed on it is likely to be rough. If the interface between the under-cladding layer and the core layer becomes rough, the propagation loss of the light propagating mainly in the core layer becomes large. In such a case, if a flattening layer is formed on the surface of the electric wiring board before forming the under-cladding layer, it can be avoided that the interface between the under-cladding layer and the core layer becomes rough. The material of the flattening layer is not especially limited, if it can function to flatten and is sufficiently adhesive to the under-cladding layer. Above all, an epoxy resin, etc. can be used. The surface of the electric wiring board can be flattened also by a method of grinding the surface of the electric wiring board, for making it smooth, instead of forming the flattening layer.

The method for forming a coating film from a paste for optical wiring is not especially limited, and for example, a spinner, screen printing, blade coater, die coater or the like can be used.

In this invention, for forming the electric wiring portion of the optoelectronic circuit board, any of processes for forming ordinary electric wiring can be used. The processes include the formation of wiring by wet etching of a metallic foil such as a copper foil as a wiring material, the formation of wiring by electrolytic plating or electroless plating of copper, nickel or gold, etc., the formation of a metallic layer by a vapor phase method such as sputtering, processing for wiring, etc. In the case where electronic parts are mounted on the optoelectronic circuit board, a usually used process such as a method using a solder can be used.

On the optoelectronic circuit board of this invention, photoelectric transducer, optical passive parts, etc. can be assembled. As the photoelectric transducer, light emitting diodes, lasers, photodetectors, etc. can be enumerated. Among these devices, it is preferred to use a planar light emitting laser for emitting light from its major surface and a planar light sensing photodetector for sensing light on its major surface can be used for such reasons that the spread of propagating light can be easily kept small, that the signal intensity can be easily made large, and the mounting structure of the light sensing and emitting portions can be easily simplified.

Further, the optoelectronic circuit board of this invention can comprise a mirror and a lens as required for optical coupling between light sensing and emitting devices and the optical waveguide. For example, the mirror for changing the optical path by 90 degrees can be formed by cutting the end face of the optical waveguide at 45° by a dicing saw, etc. Moreover, passive optical circuits such as an optical multiplexer, optical demultiplexer, wavelength filter and wavelength multiplexer can also be fabricated in the optoelectronic circuit board.

EXAMPLES

This invention is described below in reference to examples, but is not limited thereto or thereby.

Methods and conditions for measuring the respective properties are as described below.

<Refractive Index>

Model 2010 Prism Coupler (with a substrate heater) with a special P-1 prism produced by Metricon corp. was used to measure the refractive index.

(Measurement of Optical Propagation Loss)

A laser with a desired wavelength containing Model 2010 Prism Coupler produced by Metricon corp. (with an optical propagation loss measuring function) as used for the measurement of refractive index was used for measuring the optical propagation loss, and the cutback method was also used for measurement.

<Measurement of Stress (Thermal Expansion Coefficient)>

FLX-2908 produced by KLA-Tencor corp. was used to measure in a temperature range from room temperature to 90° C. A sample film was formed on both a silicon wafer and a copper substrate, respectively. While the laminates were heated, their warpages were measured. The thermal expansion coefficient was obtained by calculation.

<Thermal Cycle (TC) Test>

TSE-11-A produced by ESPEC Corp. was used to perform 500 cycles of TC test between −55° C. and 125° C. Then, film delamination and cracking were visually checked.

Example 1

A liquid epoxy resin ("Product #314" produced by Epoxy Technology Inc.) and an organo silica sol with an average particle size of 12 nm dispersed in γ-butyrolactone were mixed using a ball mill to achieve a ratio by volume of epoxy resin:silica=57:43 after curing. A quartz substrate was coated with the mixture using a spin coater, and it was dried in air using an oven at 80° C. for 1 hour, and heated in nitrogen at 150° C. for 1 hour for curing, to obtain a 10 μm thick sample for measurement of refractive index and optical propagation loss. The refractive index of the obtained sample at room temperature at a wavelength of 0.837 μm was 1.484, and the optical propagation loss was 0.49 dB/cm. Separately, a sample of the epoxy resin alone was produced as described above, and its refractive index was 1.51. From these values, the refractive index of silica particles was calculated and found to be 1.45.

The temperature was changed from 25° C. to 90° C., to measure the change of film thickness and the change of refractive index, for measuring the true dependency value of the refractive index on the temperature. The true dependency value of the refractive index on the temperature was 0.94× $10^{-4}/°$ C. Further, a stress measuring instrument was used to measure the thermal expansion coefficient in the film plane and the thermal expansion coefficient was found to be $2.3 \times 10^{-5}/°$ C.

Subsequently on the 0.8 mm thick FR-4 substrate obtained by etching out the copper foil of the surface, an epoxy-silica composite film was formed as described for producing the aforesaid sample for measuring the optical propagation loss, to obtain a sample for thermal cycle (TC) test. As a result of thermal cycle test, neither film delamination nor cracking was observed, showing no problem.

Examples 2 to 8

Samples were prepared and evaluated as described for Example 1, except that the compositions and conditions shown in Table 1 were used. Table 1 shows the evaluation results.

Example 9

Samples were prepared as described for Example 1, except that a slurry with aluminum oxide dispersed in methyl isobutyl ketone solvent was used instead of the organo silica sol, and that it was mixed to achieve a ratio by volume of epoxy-resin:aluminum oxide=60:40 after curing. The measurement wavelength used was 0.85 μm. The evaluation results are shown in Table 1.

Example 10

Samples were prepared as described for Example 1, except that a polyimide resin (trade name "Semicofine" produced by Toray Industries, Inc.) was used instead of the liquid epoxy resin ("Product #314" produced by Epoxy Technology Inc.) and that the curing temperature was changed from 150° C. to 300° C. The measurement wavelength used was 0.85 μm. The evaluation results are shown in Table 1. Meanwhile, since the curing condition exceeded the heat resistance of FR-4 substrate, the sample for TC test could not be prepared.

Examples 11-14

Samples were prepared as described for Example 1, except that a polyimide resin (trade name "Semicofine" produced by Toray Industries, Inc.) was used instead of the liquid epoxy resin ("Product #314" produced by Epoxy Technology Inc.), that the curing temperature was changed from 150° C. to 300° C., that a slurry with aluminum oxide dispersed in propylene glycol monomethyl ether solvent was used instead of the organo silica sol, and that the mixing ratio of the polyimide resin and aluminum oxide was changed as shown in Table 1. The measurement wavelength and evaluation results are shown in Table 1. Since only the sample of Example 14 was greatly warped, it was difficult to measure the refractive index at high temperature. So, the measurement was made with up to 60° C. as high temperature. Meanwhile, since the curing condition exceeded the heat resistance of FR-4 substrate, TC test samples could not be prepared in Examples 11 to 14.

Examples 15 and 16

Samples were prepared as described for Example 1, except that a polysiloxane-containing resin (trade name "K31" produced by Toray Industries, Inc.) was used instead of the liquid epoxy resin ("Product #314" produced by Epoxy Technology Inc.), and that the curing temperature was changed from 150° C. to 250° C. The measurement wavelengths used and evaluation results are shown in Table 1. Meanwhile, since the curing condition exceeded the heat resistance of FR-4 substrate, TC test samples could not be prepared.

Examples 17 and 18

Samples were prepared as described for Example 1, except that a fluorinated polyimide was used instead of the liquid epoxy resin ("Product #314" produced by Epoxy Technology Inc.) and that the curing temperature was changed from 150° C. to 350° C. The measurement wavelengths used and the evaluation results are shown in Table 1. Meanwhile, since the curing condition exceeded the heat resistance of FR-4 substrate, TC test samples could not be prepared.

Comparative Examples 1 to 3

Samples were prepared and evaluated as described for Example 1, except that some conditions were changed as shown in Table 2. The evaluation results are also shown in Table 2.

Comparative Example 4

Samples were prepared and evaluated as described for Example 1, except that a titania sol was used instead of the organo silica sol. The evaluation results are also shown in Table 2.

Comparative Example 5

Samples were prepared and evaluated as described for Example 1, except that a zirconia sol was used instead of the organo silica sol. The evaluation results are also shown in Table 2.

Comparative Examples 6 to 9

Samples were prepared and evaluated as described for Example 1, except that the resin alone was used to form a film without using the inorganic filler. The evaluation results are also shown in Table 2. In Comparative Examples 7 to 9, since the curing condition exceeded the heat resistance of FR-4, TC test samples could not be prepared.

TABLE 1

| Example | Resin Material | Resin Refractive index | Inorganic filler Material | Inorganic filler Refractive index | Average of particle size (nm) | nf/nr | Content of the inorganic filler in the resin conposition (vol %) | Refractive index of resin composition for optical wiring |
|---|---|---|---|---|---|---|---|---|
| 1 | Epoxy resin (#314) | 1.51 | Silicon dioxide | 1.45 | 12 | 1.04 | 43 | 1.484 |
| 2 | Epoxy resin (#314) | 1.51 | Silicon dioxide | 1.45 | 12 | 1.04 | 43 | 1.484 |
| 3 | Epoxy resin (#314) | 1.51 | Silicon dioxide | 1.45 | 12 | 1.04 | 44 | 1.484 |
| 4 | Epoxy resin (#314) | 1.51 | Silicon dioxide | 1.45 | 12 | 1.04 | 44 | 1.484 |
| 5 | Epoxy resin (#314) | 1.51 | Silicon dioxide | 1.45 | 7 | 1.04 | 44 | 1.484 |
| 6 | Epoxy resin (#314) | 1.51 | Silicon dioxide | 1.45 | 12 | 1.04 | 75 | 1.465 |
| 7 | Epoxy resin (#314) | 1.51 | Silicon dioxide | 1.45 | 12 | 1.04 | 85 | 1.459 |
| 8 | Epoxy resin (#314) | 1.51 | Silicon dioxide | 1.45 | 12 | 1.04 | 17 | 1.500 |
| 9 | Epoxy resin (#314) | 1.51 | Aluminum oxide | 1.7 | 12 | 1.13 | 40 | 1.586 |
| 10 | Polyimide resin | 1.63 | Silicon dioxide | 1.45 | 12 | 0.89 | 40 | 1.558 |

TABLE 1-continued

| | | | | | | | | |
|---|---|---|---|---|---|---|---|---|
| 11 | Polyimide resin | 1.63 | Magnesium oxide | 1.64 | 12 | 0.99 | 40 | 1.634 |
| 12 | Polyimide resin | 1.63 | Magnesium oxide | 1.64 | 38 | 0.99 | 20 | 1.632 |
| 13 | Polyimide resin | 1.63 | Magnesium oxide | 1.64 | 43 | 0.99 | 20 | 1.632 |
| 14 | Polyimide resin | 1.63 | Magnesium oxide | 1.64 | 12 | 0.99 | 8 | 1.631 |
| 15 | Siloxane resin (K31) | 1.48 | Silicon dioxide | 1.44 | 12 | 1.03 | 40 | 1.464 |
| 16 | Siloxane resin (K31) | 1.48 | Silicon dioxide | 1.44 | 12 | 1.03 | 40 | 1.464 |
| 17 | Fluorinated polyimide | 1.52 | Silicon dioxide | 1.44 | 12 | 1.06 | 40 | 1.488 |
| 18 | Fluorinated polyimide | 1.52 | Silicon dioxide | 1.44 | 12 | 1.06 | 40 | 1.488 |

| Example | Optical wave length ($\mu m$) | True dependency value of its refractive index on the temperature ($\times 10^{-4}/°C$) | Thermal expansion coefficient ($\times 10^{-5}/°C$) | Optical propagation loss (dB/cm) | Result of TC test |
|---|---|---|---|---|---|
| 1 | 0.837 | 0.94 | 2.3 | 0.49 | Good |
| 2 | 0.85 | 0.94 | 2.3 | 0.46 | Good |
| 3 | 0.837 | 0.01 | 2.1 | 0.5 | Good |
| 4 | 0.85 | 0.01 | 2.1 | 0.47 | Good |
| 5 | 0.85 | 0.01 | 2.1 | 0.09 | Good |
| 6 | 0.85 | −0.9 | 1.3 | 0.8 | Good |
| 7 | 0.85 | −0.98 | 1 | 0.91 | Crack detected at some part |
| 8 | 0.85 | 0.99 | 3.9 | 0.47 | Good |
| 9 | 0.85 | 0.88 | 1.8 | 10 | Good |
| 10 | 0.85 | 0.09 | 1.8 | 4.4 | — |
| 11 | 0.85 | 0.09 | 1.9 | 0.04 | — |
| 12 | 0.837 | 0.61 | 2.9 | 0.37 | — |
| 13 | 0.837 | 0.61 | 2.9 | 0.53 | — |
| 14 | 0.837 | 0.91 | 3.6 | 0.1 | — |
| 15 | 1.31 | 0.04 | 1.6 | 0.08 | Good |
| 16 | 1.55 | 0.04 | 1.6 | 0.08 | Good |
| 17 | 1.31 | 0.09 | 1.8 | 0.32 | — |
| 18 | 1.55 | 0.09 | 1.9 | 0.08 | — |

TABLE 2

| Comparative example | Resin | | Inorganic filler | | | | Content of the inorganic filler in the resin composition (vol %) | Refractive index of resin composition for optical wiring |
|---|---|---|---|---|---|---|---|---|
| | Material | Refractive index | Material | Refractive index | Average of particle size (nm) | nf/nr | | |
| 1 | Epoxy resin (#314) | 1.51 | Silicon dioxide | 1.45 | 110 | 1.04 | 43 | A reliable measurement was impossible |
| 2 | Epoxy resin (#314) | 1.51 | Silicon dioxide | 1.45 | 7 | 1.04 | 3 | 1.508 |
| 3 | Epoxy resin (#314) | 1.51 | Silicon dioxide | 1.45 | 7 | 1.04 | 96 | A reliable measurement was impossible |
| 4 | Epoxy resin (#314) | 1.51 | Titanium oxide | 2.1 | 12 | 1.4 | 43 | 1.764 |
| 5 | Epoxy resin (#314) | 1.51 | Zirconium dioxide | 2 | 12 | 1.33 | 43 | 1.721 |
| 6 | Epoxy resin (#314) | 1.51 | — | — | — | — | — | |
| 7 | Polyimide | 1.63 | — | — | — | — | — | |
| 8 | Siloxane resin (K31) | 1.48 | — | — | — | — | — | |
| 9 | Fluorinated polyimide | 1.52 | — | — | — | — | — | |
| 10 | Aramid resin | 1.64 | — | — | — | — | — | |

TABLE 2-continued

| Comparative example | Optical wave length (μm) | True dependency value of its refractive index on the temperature ($\times 10^{-4}$/° C.) | Thermal expansion coefficient ($\times 10^{-5}$/° C.) | Optical propagation loss (dB/cm) | Result of TC test |
|---|---|---|---|---|---|
| 1 | 0.837 | A reliable measurement was impossible | 2.3 | unmeasurable large | Good |
| 2 | 0.837 | 1.47 | 6.9 | 0.08 | Delamination detected |
| 3 | 0.837 | A reliable measurement was impossible | A reliable measurement was impossible | A reliable measurement was impossible | Delamination detected |
| 4 | 0.837 | 1.1 | 3.5 | unmeasurable large | Good |
| 5 | 0.837 | 1.2 | 3.1 | unmeasurable large | Good |
| 6 | 0.837 | — | 7 | 0.08 | — |
| 7 | 0.837 | — | 4 | 0.08 | — |
| 8 | 1.31 | — | 5 | 0.08 | — |
| 9 | 1.55 | — | 4.5 | 0.08 | — |
| 10 | 0.837 | — | 4 | 0.08 | Delamination detected |

Example 19

A bead mill was used to mix 17.4 parts by weight of barium sulfate (BF-40, average particle size 10 nm, produced by Sakai Chemical Industry Co., Ltd.) with 80 parts by weight of N,N-dimethylacetamide and 2.6 parts by weight of a dispersing agent ("Disperbyk-111" produced by BYK-Chemie Japan K.K.), to obtain a dispersion. The dispersion, a liquid epoxy resin ("Epiclon" HP4032D produced by Dainippon Ink and Chemicals, Inc.) and a curing accelerator (2-ethyl-4-methylimidazole) were mixed using a ball mill, to achieve a ratio by volume of epoxy resin:barium sulfate=73:27 after curing, for preparing a paste for optical wiring. The mixing ratio by weight of the liquid epoxy resin and the curing accelerator was 100:2.

A quartz substrate was coated with the paste for optical wiring using a spin coater, and it was dried at 80°C. for 1 hour in air using an oven and heated in nitrogen at 180° C. for 1 hour for curing, to obtain a 4 μm thick sample for measurement of optical propagation loss. The evaluation results are shown in Table 3. Further, a bar coater was used to form films with a thickness of 10, 20, 30, 40 and 50 μm, respectively as solidified film thickness from the obtained paste for optical wiring.

Example 20

A sample was prepared as described for Example 19, except that the ratio by volume after curing was epoxy resin:barium sulfate=60:40. The evaluation results are shown in;Table 3. Further, a bar coater was used to form films with a thickness of 10, 20, 30, 40 and 50 μm, respectively as solidified film thickness from the obtained paste for optical wiring.

Example 21

A sample was prepared as described for Example 19, except that a double oxide of titanium and silicon with a refractive index of 1.61 was used instead of barium sulfate and that the ratio by volume of the double oxide of titanium and silicon-and the liquid epoxy resin after curing was double oxide:epoxy resin=20:80. The evaluation results are shown in Table 3. Further, a bar coater was used to form films with a thickness of 10, 20, 30, 40 and 50 μm, respectively as solidified film thickness from the obtained composition.

Example 22

An aramid resin obtained by polymerizing 9,9-bis(4-amino-3-fluorophenyl)fluorene and 2-chloro-terephthalic acid dichloride was used instead of the liquid epoxy resin of Example 19. The aramid resin and the barium sulfate dispersion used in Example 19 were mixed to achieve aramid resin:barium sulfate=60:40 using a ball mill, to obtain a paste for optical wiring.

A quartz substrate was coated with the paste for optical wiring using a spin coater, and it was heated at 80° C. for 30 minutes, then at 150° C. for 30 minutes, and further at 280° C. for 1 minute in air using an oven, to obtain a 5 μm thick sample for measurement of optical propagation loss. The evaluation results are shown in Table 3. Further, a bar coater was used to form films with a thickness of 10, 20, 30, 40 and 50 μm, respectively as solidified film thickness from the obtained composition.

TABLE 3

| Example | Resin Material | Resin Refractive index | Inorganic filler Material | Inorganic filler Refractive index | Average of particle size (nm) | nf/nr | Content of the inorganic filler in the resin conposition (vol %) | Refractive index of resin composition for optical wiring |
|---|---|---|---|---|---|---|---|---|
| 19 | Epoxy resin (HP4032D) | 1.61 | Barium sulfate | 1.64 | 10 | 1.01 | 27 | 1.618 |
| 20 | Epoxy resin (HP4032D) | 1.61 | Barium sulfate | 1.64 | 10 | 1.01 | 40 | 1.622 |
| 21 | Epoxy resin (HP4032D) | 1.61 | Titaniumu-Silicon double oxide | 1.61 | 30 | 1 | 20 | 1.610 |
| 22 | Aramid resin | 1.64 | Barium sulfate | 1.64 | 10 | 1 | 40 | 1.640 |

| Example | Optical wave length (μm) | True dependency value of its refractive index on the temperature (×10$^{-4}$/° C.) | Thermal expansion coefficient (×10$^{-5}$/° C.) | Optical propagation loss (dB/cm) | Result of TC test |
|---|---|---|---|---|---|
| 19 | 0.85 | 0.3 | 3.7 | 0.08 | Good |
| 20 | 0.85 | 0.1 | 2 | 0.1 | Good |
| 21 | 0.85 | 0.4 | 4 | 0.2 | Good |
| 22 | 0.85 | 0.05 | 1.5 | 0.06 | Good |

Example 23

A 10 μm thick under-cladding layer was formed on a 0.6 mm thick FR-4 substrate-with a blackening-treated 18 μm thick copper foil. The under-cladding layer was formed as described below. An organo silica sol with an average particle size of 7 nm dispersed in γ-butyrolactone was mixed with a liquid epoxy resin ("Product #314" produced by Epoxy Technology Inc.) using a ball mill to achieve a ratio by volume of epoxy resin:silica=57:43 after curing, to obtain a paste for optical wiring. The FR-4 substrate was coated with the paste using a spin coater, and it was dried at 80° C. for 1 hour in air using an oven, and heated at 150° C. for 1 hour in nitrogen for curing, to obtain an FR-4 substrate with an under-cladding layer. The refractive index of the under-cladding layer was 1.484.

Then, magnesium oxide with a particle size of 12 nm dispersed in propylene glycol monomethyl ether solvent was added to a resin solution with an imidized polyimide dissolved, to achieve a ratio by volume of polyimide rein:magnesium oxide=60:40 after curing, for preparing a paste for optical wiring. The aforesaid FR-4 substrate with an under-cladding layer was coated with the paste, and it was dried at 80° C. for 1 hour and solidified in nitrogen at 180° C. for 1 hour, to form a 40 μm thick core layer. The refractive index of the core layer was 1.634. Then, ordinary photolithography and reactive ion etching were used to transform the 50 μm wide core layer as a ridge.

Moreover, the laminate was coated on the core layer with a paste for an over-cladding layer with quite the same composition as that of the under-cladding layer, and it was dried at 80° C. for 1 hour, to form a non-cured over-cladding layer. On it, a 0.6 mm thick FR-4 substrate with a blackening-treated 18 μm thick copper foil was overlaid, and they were pressed by a hot press at 150° C. for 1 hour, to obtain an optoelectronic circuit board.

The optoelectronic circuit board was carefully cut using a dicing device (DFD-6240 produced by Disco Corporation), to form end faces perpendicular to the optical waveguide. In this way, an optoelectronic circuit board with an optical waveguide length of 5 cm having said end faces formed at both the ends of the substrate was obtained. From one of the end faces, light with a wavelength of 0.85 μm was introduced by a single mode optical fiber, and a photodetector was used to receive light from the other end face. The optical propagation loss was measured by the cutback method and found to be 0.1 dB/cm. In the cutback method, the dicing device was used to cut the sample, and the optical propagation loss (in dB/cm) was obtained from the propagated light intensity of the sample with an optical waveguide length of 5 cm before cutting and the propagated light intensity of the sample with an optical waveguide length of 2 cm after cutting.

Further, the optical fiber for light introduction was moved right and left and up and down, and from the light output detected by the photodetector at the other end face, the light introduction margin was examined. When the optical fiber was moved by 10 μm both right and left and up and down, the light output detected by the photodetector little changed.

A TC test of the said optoelectronic circuit board was performed, and neither delamination nor cracking was observed. The optical propagation loss was measured again by the cutback method and found to be 3.1 dB/cm.

Example 24

A paste for optical wiring was prepared as described for Example 1, except that an organo silica sol with an average particle size of 12 nm dispersed in γ-butyrolactone was mixed with a liquid epoxy resin ("Product #314" produced by Epoxy Technology Inc.) using a ball mill, to achieve a ratio by volume of epoxy resin:silica=80:20 after curing. Then, an optoelectronic circuit board was prepared as described for Example 23, except that the obtained paste for optical wiring was used to form a core layer. The refractive index of the core layer was measured and found to be 1.498.

The light introduction margin was examined as described for Example 23. The light output detected by the photodetector was sensitive to the movement of the optical fiber used for light introduction, and the output of the photodetector did not become stable in relation with the movement of the optical fiber. A TC test of the sample was performed, and neither delamination nor cracking was observed.

Example 25

Figure 2:
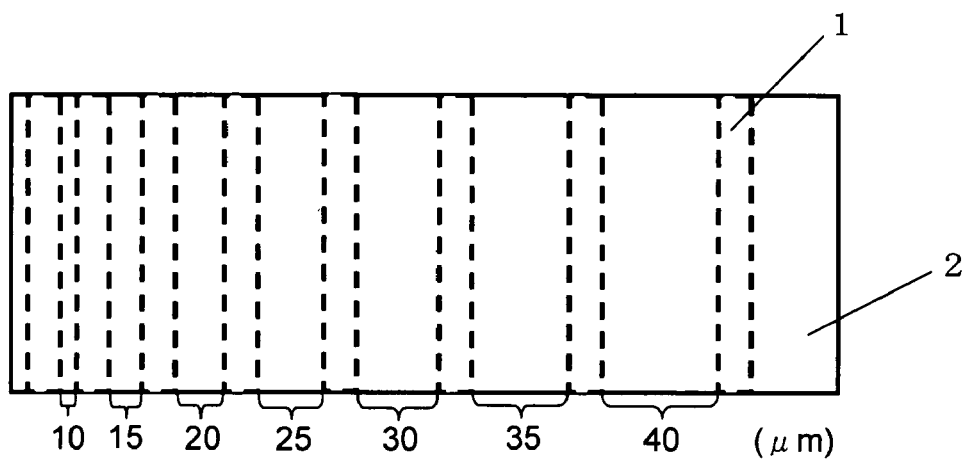
FIG. 2 is a top view of the optical wiring substrate for evaluation of crosstalk shown in FIG. 1.

FIG. 1 is a cross sectional view of the optical wiring substrate for evaluation of crosstalk characteristics prepared in this example. The FR-4 substrate 5 with the under-cladding layer 3 (refractive index [nb]: 1.484) used in Example 23 was coated with the paste for optical wiring used in Example 20, to form plural 50 μm wide parallel core layers 1 (refractive index [na]: 1.62), to ensure that pitches of 10, 15, 20, 25, 30, 35 and 40 μm could be provided between straight optical waveguides. Subsequently, as described for Example 23, the over-cladding layer 2 and the end faces of optical waveguides were formed, to prepare an optical wiring substrate. The core layers were formed in parallel to each other at the aforesaid pitches as shown in FIG. 2. Meanwhile, FIG. 2 is a view in which the optical wiring substrate for evaluation of crosstalk characteristics was observed from top, and the core layers were located at the portions indicated by dot lines.

Whether or not crosstalk occurred at the respective wiring pitches was examined by the following method. From one end face of each optical waveguide, light with a wavelength of 0.85 μm was introduced using a single mode optical fiber, and the adjacent optical waveguides were observed in the direction perpendicular to the substrate face using a CCD camera, to confirm whether or not crosstalk light was observed. The results are shown in Table 4.

Example 26

An epoxy resin solution with 60 parts by weight of "Epikote" 157S70 (produced by Japan Epoxy Resins Co., Ltd.) dissolved in 40 parts by weight of methyl isobutyl ketone and an organo silica sol with an average particle size of 7 nm dispersed in γ-butyrolactone were mixed using a ball mill to achieve a ratio by volume of epoxy resin:silica=85:15 after curing, to prepare a paste for cladding layers. An optoelectronic circuit board was prepared as described for Example 25, except that this paste was used to form the under-cladding layer (refractive index [nb]: 1.56) and the over-cladding layer. The evaluation results of crosstalk are shown in Table 4.

Example 27

A bead mill was used to mix 17.4 parts by weight of barium sulfate (BF-40 produced by Sakai Chemical Industry Co., Ltd.), 80 parts by weight of N,N-dimethylacetamide, and 2.6 parts by weight of a dispersing agent ("Disperbyk-111" produced by BYK-Chemie Japan K.K.), to obtain a dispersion.

The dispersion, a liquid epoxy resin ("Epiclon" HP4032D produced by Dainippon Ink and Chemicals, Inc.) and a curing accelerator (2-ethyl-4-methylimidazole) were mixed using a ball mill, to achieve a ratio by volume of epoxy resin:barium sulfate=73:27 after curing, for preparing a paste for optical wiring. The mixing ratio by weight of the liquid epoxy resin and the curing accelerator was 100:2.

An optoelectronic circuit board was prepared as described for Example 25, except that the obtained paste for cladding layers was used to form the under-cladding layer (refractive index [nb]: 1.58) and the over-cladding layer. The evaluation results of crosstalk are shown in Table 4.

TABLE 4

| | Refractive index | | | | Wiring pitch of optical waveguides (μm) | | | | | | |
|---|---|---|---|---|---|---|---|---|---|---|---|
| | Under cladding layer | Core layer | Over cladding layer | na-nb | 10 | 15 | 20 | 25 | 30 | 35 | 40 |
| Example 25 | 1.484 | 1.62 | 1.484 | 0.136 | Cross talk detected | No cross talk | No cross talk | No cross talk | No cross talk | No cross talk | No cross talk |
| Example 26 | 1.56 | 1.62 | 1.56 | 0.06 | Cross talk detected | Cross talk detected | No cross talk | No cross talk | No cross talk | No cross talk | No cross talk |
| Example 27 | 1.58 | 1.62 | 1.58 | 0.04 | Cross talk detected | Cross talk detected | Cross talk detected | Cross talk detected | Cross talk detected | No cross talk | No cross talk |

Comparative Example 10

Samples were prepared and evaluated as described for Example 22, except that the resin alone was used to form a film without using the inorganic filler. The evaluation results are shown in Table 2.

INDUSTRIAL APPLICABILITY

The resin composition for optical wiring of this invention can be suitably used, for example, as optical wiring to perform information transmission between LSIs in the wiring substrates used in information equipments for high speed signal transmission, such as personal computers, hard disc recorders, DVD recorders, video game console and cell phones.

The invention claimed is:

1. A resin composition for optical wiring, comprising an inorganic filler with an average particle size of 1 nm to 100 nm and a thermosetting resin, said composition having a ratio $n_f/n_r$ where ($n_f$ is the refractive index of the inorganic filler and $n_r$ is the refractive index of the) resin of 0.8 to 1.2, a thermal expansion coefficient of $-1\times10^{-5}$/° C. to $4\times10^{-5}$/° C., and a true dependency value of its refractive index on temperature of $-1\times10^{-4}$/° C. to $1\times10^{-4}$/° C. in a temperature range from $-20°$ C. to $90°$ C., and substantially incapable of absorbing light in a wavelength range from 0.6 to 0.9 μm or from 1.2 to 1.6 μm.

2. A resin composition for optical wiring, according to claim 1, wherein the volume content of the inorganic filler, the average particle size of the inorganic filler, the refractive index of the inorganic filler and the refractive index of the thermosetting resin satisfy the following formula (1):

[Numerical formula 1] (1)

$$0 \leq L = -10 \log e^{-x} \leq 0.5$$

$$x = V \times \frac{6}{\pi(a \times 10^{-7})^3} \times \frac{8}{3}\left(\frac{\pi n_r a \times 10^{-7}}{\lambda \times 10^{-4}}\right)^4 \left(\frac{\left(\frac{n_f}{n_r}\right)^2 - 1}{\left(\frac{n_f}{n_r}\right)^2 + 2}\right)^2 \frac{\pi(a \times 10^{-7})^2}{4}$$

where V is the volume content of the inorganic filler; a is the average particle size (nm) of the inorganic filler; $n_f$ is the refractive index of the inorganic filler; $n_r$ is the refractive index of the thermosetting resin; and λ is the wavelength (μm) of the light waveguided in the optical wiring; subject to $0.05 \leq V \leq 0.95$, $1 \leq a \leq 100$, $1.2 \leq n_f \leq 2.4$, $1.3 \leq n_r \leq 2.0$, and $0.6 \leq \lambda \leq 0.9$ or $1.2 \leq \lambda \leq 1.6$.

3. A resin composition for optical wiring, according to claim 1, wherein the thermal expansion coefficient is $1.5 \times 10^{-5}/°C$ to $3 \times 10^{-5}/°C$.

4. A resin composition for optical wiring, according to claim 1, wherein the average particle size of the inorganic filler is 1 nm to 40 nm.

5. A resin composition for optical wiring, according to claim 1, wherein the inorganic filler is at least one selected from materials containing any bond of Si—O bond, Mg—O bond and Al—O bond and metal sulfates.

6. A resin composition for optical wiring, according to claim 1, wherein the curing temperature is 200° C. or lower.

7. A resin composition for optical wiring, according to claim 1, wherein the thermosetting resin and the inorganic filler are respectively one each selected from the following group A with a refractive index of 1.55 to 1.75 and the following group B with a refractive index of 1.55 to 1.75, or respectively one each selected from the following group C with a refractive index of 1.3 to 1.55 and the following group D with a refractive index of 1.3 to 1.55:
  group A: polyimide resins, and epoxy resins
  group B: barium sulfate, magnesium oxide, aluminum oxide, calcium carbonate, zinc oxide, tin oxide, and a double oxide of titanium and silicon
  group C: epoxy resins, siloxane resins, polyimide resins, and polysilanes
  group D: silica, magnesium carbonate, calcium silicate, hydrotalcite, magnesium fluoride, and a double oxide of titanium and silicon.

8. An optoelectric circuit board comprising a layer having an organic substance and a fiber material, a Conductive layer and an optical waveguide layer, wherein the optical waveguide layer contains the resin composition as set forth in claim 1.

9. An optoelectronic circuit board, according to claim 8, wherein at least two optical waveguide layers different in refractive index are provided, and the refractive index difference between the two layers is 0.05 or more.

10. A resin composition for optical wiring, comprising an inorganic filler with an average particle size of 1 nm to 100 nm and a thermosetting resin, with the inorganic filler content kept in a range from 5 vol % to 95 vol %, said composition having a ratio $n_f/n_r$, where is the refractive index of the inorganic filler and $n_r$ is the refractive index of the resin of 0.8 to 1.2, a thermal expansion coefficient of $-1 \times 10^{-5}/°C$ to $4 \times 10^{-5}/°C$, and a true dependency value of its refractive index on temperature of $-1 \times 10^{-4}/°C$ to $1 \times 10^{-4}/°C$ in a temperature range from $-20°$ C. to $90°$ C., and substantially incapable of absorbing light in a wavelength range from 0.6 to 0.9 μm or from 1.2 to 1.6 μm.

11. A resin composition for optical wiring, according to claim 10, wherein the volume content of the inorganic filler, the average particle size of the inorganic filler, the refractive index of the inorganic filler and the refractive index of the thermosetting resin satisfy the following formula (1):

[Numerical formula 1] (1)

$$0 \leq L = -10 \log e^{-x} \leq 0.5$$

$$x = V \times \frac{6}{\pi(a \times 10^{-7})^3} \times \frac{8}{3}\left(\frac{\pi n_r a \times 10^{-7}}{\lambda \times 10^{-4}}\right)^4 \left(\frac{\left(\frac{n_f}{n_r}\right)^2 - 1}{\left(\frac{n_f}{n_r}\right)^2 + 2}\right)^2 \frac{\pi(a \times 10^{-7})^2}{4}$$

where V is the volume content of the inorganic filler; a is the average particle size (nm) of the inorganic filler; $n_f$ is the refractive index of the inorganic filler; $n_r$ is the refractive index of the thermosetting resin; and λ is the wavelength (μm) of the light waveguided in the optical wiring; subject to $0.05 \leq V \leq 0.95$, $1 \leq a \leq 100$, $1.2 \leq n_f \leq 2.4$, $1.3 \leq n_r \leq 2.0$, and $0.6 \leq \lambda \leq 0.9$ or $1.2 \leq \lambda \leq 1.6$.

12. A resin composition for optical wiring, according to claim 2, wherein the thermal expansion coefficient is $1.5 \times 10^{-5}/°C$ to $3 \times 10^{-5}/°C$.

13. A resin composition for optical wiring, according to claim 10, wherein the average particle size of the inorganic filler is 1 nm to 40 nm.

14. A resin composition for optical wiring, according to claim 10, wherein the inorganic filler is at least one selected from materials containing any bond of Si—O bond, Mg—O bond and Al—O bond and metal sulfates.

15. A resin composition for optical wiring, according to claim 10, wherein the curing temperature is 200° C. or lower.

16. A resin composition for optical wiring, according to claim 10, wherein the thermosetting resin and the inorganic filler are respectively one each selected from the following group A with a refractive index of 1.55 to 1.75 and the following group B with a refractive index of 1.55 to 1.75, or respectively one each selected from the following group C with a refractive index of 1.3 to 1.55 and the following group D with a refractive index of 1.3 to 1.55:
  group A: polyimide resins, and epoxy resins
  group B: barium sulfate, magnesium oxide, aluminum oxide, calcium carbonate, zinc oxide, tin oxide, and a double oxide of titanium and silicon
  group C: epoxy resins, siloxane resins, polyimide resins, and polysilanes
  group D: silica, magnesium carbonate, calcium silicate, hydrotalcite, magnesium fluoride, and a double oxide of titanium and silicon.

17. An optoelectronic circuit board comprising a layer having an organic substance and a fiber material, a conductive layer and an optical waveguide layer, wherein the optical waveguide layer contains the resin composition as set forth in claim 10.

18. An optoelectronic circuit board, according to claim 17, wherein at least two optical waveguide layers different in refractive index are provided, and the refractive index difference between the two layers is 0.05 or more.

* * * * *